United States Patent [19]
Kinoshita et al.

[11] Patent Number: 5,304,628
[45] Date of Patent: Apr. 19, 1994

[54] RADIATION-CURING RESIN COMPOSITION

[75] Inventors: Masashi Kinoshita, Tokyo; Hidenobu Ishikawa, Chiba, both of Japan

[73] Assignee: Dainippon Ink and Chemicals, Inc., Tokyo, Japan

[21] Appl. No.: 924,748

[22] Filed: Aug. 4, 1992

[30] Foreign Application Priority Data

Aug. 5, 1991 [JP] Japan .................................. 3-195340

[51] Int. Cl.$^5$ .................... C08F 2/50; C08G 63/52; C08G 18/00
[52] U.S. Cl. ...................... 528/370; 528/44; 528/75; 528/306; 522/16; 522/97; 522/100; 522/101; 522/163
[58] Field of Search ............. 522/163, 92, 93, 94, 522/100, 101, 60, 68, 16, 97; 528/370, 44, 75, 306; 525/485, 524, 526

[56] References Cited

U.S. PATENT DOCUMENTS

| | | | |
|---|---|---|---|
| 3,280,078 | 10/1966 | Hostettler et al. | 522/163 |
| 4,500,704 | 2/1985 | Kruper, Jr. et al. | 528/370 |
| 4,686,276 | 8/1987 | Myers | 528/370 |
| 4,808,658 | 2/1989 | Walz et al. | 528/49 |
| 4,948,700 | 8/1990 | Maeda et al. | 522/101 |
| 5,100,767 | 3/1992 | Yanagawa et al. | 522/100 |
| 5,102,702 | 4/1992 | Grundke et al. | 525/526 |
| 5,175,231 | 12/1992 | Rappaport et al. | 528/106 |

Primary Examiner—Susan Berman
Attorney, Agent, or Firm—Armstrong, Westerman, Hattori, McLeland & Naughton

[57] ABSTRACT

A radiation-curing resin composition comprising (A) a resin having a carboxylic acid group and an unsaturated double bond and (B) a compound containing a cyclocarbonate group. The composition is excellent in stability and curing properties and provides a cured film excellent in water resistance, solvent resistance, chemical resistance, and heat resistance.

2 Claims, No Drawings

RADIATION-CURING RESIN COMPOSITION

FIELD OF THE INVENTION

This invention relates to a novel radiation-curing resin composition. Specifically, it relates to a radiation-curing resin composition comprising (A) a resin having a carboxylic acid group and an unsaturated double bond and (B) a compound containing a cyclocarbonate group. Particularly, it relates to a radiation-curing resin composition comprising (A) a reaction product obtained from a compound containing an epoxy group, a compound containing a functional group reactive with the epoxy group of said epoxy group-containing compound and a reactive unsaturated double bond, and a compound containing an acid anhydride group and (B) a compound containing a cyclocarbonate group.

The radiation-curing resin composition according to the present invention cures on irradiation with so-called radiation, such as ultraviolet light and electron beam, and is suitable for a variety of uses as a coating compound, a printing ink, an adhesive, etc. The resin composition is particularly suitable for the use in which durability is required after subjecting to a pattern making step by development.

BACKGROUND OF THE INVENTION

Known radiation-curing resins, particularly resins which cures on radical polymerization, include unsaturated polyester resins, vinyl ester resins (epoxy-acrylate resins), various acrylate oligomers, and diallyl phthalate prepolymers. These resins are widely employed with their respective characteristics being taken advantage of in the respective field of application.

With the recent broadening of uses of radiation-curing resin compositions, demands for higher performance properties have ever been increasing. However, there has not yet been obtained a highly practical radiation-curing resin composition which satisfies all the requirements.

Further, with the recent broadening of uses of radiation-curing resin compositions, demands as pattern making materials have been increasing. As alkali development-type pattern making materials, those containing a carboxylic acid group have been generally used. However, when the alkali development-type pattern making materials containing a carboxylic acid group are used especially as electric materials, the carboxylic acid group affects the water resistance and the chemical resistance. In order to remove such a defect, there has been proposed to use a resin composition containing an epoxy compound together with the alkali development-type pattern making material containing a carboxylic acid group wherein a carboxylic acid is consumed by postcure. However, the conventional resin composition which contains epoxy compound has had serious defects for reducing pattern developing property due to poor stability.

SUMMARY OF THE INVENTION

An object of the present invention is to provide an extremely practical radical-curing resin which is excellent in water resistance, solvent resistance, chemical resistance, heat resistance, and curing properties, and a resin composition which has excellent stability.

As a result of extensive investigations, the inventors have found that a combination of (A) a specific radiation-curing resin, i.e., a resin having a carboxylic acid group and an unsaturated double bond, particularly a reaction product obtained from a compound containing an epoxy group, a compound containing a functional group reactive with the epoxy group of said epoxy group-containing compound and an unsaturated double bond, and a compound containing an acid anhydride group, and (B) a cyclocarbonate-containing compound is an extremely stable one-pack type radiation-curing resin composition which, on ultraviolet curing followed by postcure, provides a cured film satisfying all the above-described performance requirements. The present invention has been completed based on this finding.

The present invention provides a radiation-curing resin composition comprising, as essential components, (A) a resin having a carboxylic acid group and an unsaturated double bond (hereinafter referred to as compound (A)) and (B) a compound containing a cyclocarbonate group (hereinafter referred to as compound (B)), and particularly the present invention provides (A) a reaction product obtained from a compound containing an epoxy group, a compound containing a functional group reactive with the epoxy group of said epoxy group-containing compound and an unsaturated double bond, and a compound containing an acid anhydride group.

DETAILED DESCRIPTION OF THE INVENTION

Compound (A) having a carboxylic acid group and an unsaturated double bond which can be preferably used in the present invention is a reaction product obtained from a compound containing an epoxy group, a compound containing a reactive unsaturated double bond, and a compound containing an acid anhydride group, or a reaction product obtained from a compound containing an epoxy group, a compound containing an unsaturated monocarboxylic acid, and a compound containing an acid anhydride group.

More specifically, while not limiting, resin (A) includes those having a structure resulting from the reaction between a compound containing an epoxy group (hereinafter referred to as compound (a-1)) and an unsaturated monocarboxylic acid (hereinafter referred to as compound (a-2)).

Typical examples of compound (a-1) include glycidyl ether type epoxy resins, such as a bisphenol A type epoxy resin obtained by reacting bisphenol A and epichlorohydrin in the presence of an alkali and an epoxy resin obtained by using brominated bisphenol A in place of bisphenol A in the above reaction.

In addition, novolak type epoxy resins, phenol novolak type epoxy resins, and orthocresol novolak type epoxy resins, which are obtained by reacting a novolak resin with epichlorohydrin, are also used as compound (a-1).

Also included in compound (a-1) are bisphenol F type epoxy resins obtained by reacting bisphenol F and epichlorohydrin, brominated epoxy resins derived from tetrabromobisphenol A, cyclic aliphatic epoxy resins having a cyclohexene oxide group, a tricyclodecene oxide group or a cyclopentene oxide group; glycidyl ester resins, such as diglycidyl phthalate, diglycidyl tetrahydrophthalate, diglycidyl hexahydrophthalate, diglycidyl p-hydroxybenzoate, and dimeric acid glycidyl esters; glycidylamine resins, such as tetraglycidyl-diaminodiphenylmethane, triglycidyl-p-aminophenol, diglycidylaniline, diglycidyltoluidine, tetraglycidyl-m- xylylenediamine, diglycidyltribromoaniline, and tetraglycidylbisaminomethylcyclohexane; hydantoin type epoxy resins having a glycidylated hydantoin ring; and triglycidyl isocyanurate having a triazine ring.

These epoxy group-containing compounds (a-1) may be used either individually or in combination of two or more thereof.

Typical examples of compound (a-2) include acrylic acid, methacrylic acid, crotonic acid, and cinnamic acid, with acrylic acid being preferred. These compounds may be used either individually or in combination of two or more thereof.

Typical examples of the compound containing an acid anhydride group include acid anhydrides of maleic acid, fumaric acid, itaconic acid, citraconic acid, tetrahydrophthalic acid, HET acid, hymic acid, chlorendic acid, dimeric acid, adipic acid, succinic acid, alkenylsuccinic acids, sebacic acid, azelaic acid, 2,2,4-trimethyladipic acid, terephthalic acid, 2-potassium sulfoterephthalic acid, 2-sodium sulfoterephthalic acid, 2-isophthalic acid, 2-potassium sulfoisophthalic acid, 2-sodium sulfoisophthalic acid, and 5-sodium sulfoisophthalic acid; orthophthalic anhydride, 4-sulfophthalic anhydride, 1,10-decamethylenedicarboxylic acid anhydride, muconic anhydride, oxalic anhydride, malonic anhydride, glutaric anhydride, trimellitic anhydride, hexahydrophthalic anhydride, tetrabromophthalic anhydride, methylcyclohexenetricarboxylic acid anhydride, and pyromellitic anhydride.

Typical but non-limiting specific examples of compound (B) include those obtained by converting epoxy groups of the above-mentioned epoxy group-containing compounds (a-1), e.g., tris(2,3-epoxypropyl) isocyanurate (trifunctional epoxy compound having a triazine ring), to cyclocarbonate groups.

The compounds obtained by converting epoxy groups to cyclocarbonate groups can generally be produced by dissolving an epoxy resin in propylene carbonate, blowing carbon dioxide ($CO_2$) into the solution, and then allowing to react by using a tertiary amine such as dimethylbutylamine as a catalyst at usually from 100° to 120 ° C. for 3 to 6 hours.

In the resin composition of the present invention, the proportion of compound (A) to compound (B) is set so that the cyclocarbonate group equivalent in compound (B) to the carboxylic acid group equivalent in compound (A) is 20/80 to 80/20, preferably 25/75 to 55/45 (equivalent ratio). If the ratio of the equivalent of carboxylic acid groups to the equivalent of cyclocarbonate groups is less than 20/80, heat resistance is decreased, and if it is larger than 80/20, the resulting resin composition is insufficient in water resistance and alkali resistance.

The radiation-curing resin composition of the present invention is of one-pack type and excellent in storage stability. The UV-non-irradiated resin composition of the invention, which is easily soluble in both alkaline solution and solvents, provides on UV irradiation followed by postcure a cured film excellent in water resistance, solvent resistance, chemical resistance, and heat resistance.

If desired, the radiation-curing resin composition comprising resin (A) and compound (B) may further contain other known epoxy compounds and/or commonly employed additives as far as the purposed characteristics, especially storage preservability, water resistance, solvent resistance, chemical resistance, and heat resistance are not impaired. Usable additives include reactive diluents, organic solvents, and catalysts of epoxy ring opening.

While a broad range of reactive diluents, from monofunctional to polyfunctional, may be employed, typical examples of usable reactive diluents are 2-hydroxyethyl (meth)acrylate, 2-hydroxypropyl (meth)acrylate, 2-ethylhexyl (meth)acrylate, N-vinylpyrrolidone,1-vinylimidazole,isobornyl (meth)acrylate, tetrahydrofurfuryl (meth)acrylate, carbitol (meth)acrylate, phenoxyethyl (meth)acrylate, dicyclopentadiene (meth)acrylate,1,3-butanedioldi(meth)acrylate,1,6-hexanediol di(meth)acrylate, polyethylene glycol di(meth)acrylate, hydroxypivalic esters neopentylglycol di(meth)acrylate, trimethylolpropane tri(meth)acrylate, pentaerythritol tri(meth)acrylate, pentaerythritol tetra(meth)acrylate, and dipentaerythritol hexa(meth)acrylate.

Typical but non-limiting examples of usable organic solvents include aromatic hydrocarbons, e.g., toluene and xylene; ketones, e.g., methyl ethyl ketone, methyl isobutyl ketone, and cyclohexanone; esters, e.g., methyl acetate, ethyl acetate, and butyl acetate; alcohols, e.g., methanol, ethanol, propanol, and butanol; aliphatic hydrocarbons, e.g., hexane and heptane; and also cellosolve acetate, carbitol acetate, dimethylformamide, and tetrahydrofuran.

The term "radiation" as used herein means ionizing radiations and light inclusively, such as electron beams, $\alpha$-rays, $\beta$-rays, $\gamma$-rays, X-rays, neutron rays, and ultraviolet light.

Where ultraviolet light are used as radiations for curing the resin composition of the present invention, it is preferably to use a photo initiator which is dissociated by ultraviolet light having a wavelength of from 1,000 to 8,000 Å to generate a radical. Any of commonly employed photo initiators may be used. Typical examples of usable photo initiators are acetophenones, benzophenone, Michler's ketone, benzil, benzoin benzoate, benzoin, benzoin methyl ethers, benzyl dimethyl ketal, $\alpha$-acyloxime ester, thioxanthones, anthraquinones, and derivatives thereof.

The photo initiator may be used in combination with a known photosensitizers. Typical examples of usable photosensitizers include amine compounds, urea compounds, sulfur-containing compounds, phosphorus-containing compounds, chlorine-containing compounds, nitriles, and other nitrogen-containing compounds.

The catalyst for epoxy ring opening includes amine compounds, acid anhydrides, imidazole derivatives, Lewis acids, Lewis acid salts, and phosphorus compounds.

The radiation-curing resin composition of the present invention is usually cured as such by irradiation with radiation or actinic radiation using the above-mentioned energy source and then postcured by heating.

The present invention is now illustrated in greater detail with reference to Synthesis Examples and Examples, but it should be understood that the present invention is not construed as being limited thereto. All the parts and percents are by weight unless otherwise indicated.

SYNTHESIS EXAMPLE 1

In a flask equipped with a thermometer, a stirrer, and a reflux condenser were charged 213 g of a cresol novolak type epoxy resin having an epoxy equivalent of 213 ("Epiclon N-695" produced by Dainippon Ink and Chemicals, Inc.), 72.0 g of acrylic acid, and 1.2 g of triphenylphosphine. The mixture was allowed to react at 110° C. until the acid value became 3 or less. Thereafter, 152 g of tetrahydrophthalic anhydride was added to the reaction mixture, and the reaction was further conducted at 100° C. until the acid value reached 130 to obtain a resin having a carboxylic acid group and an unsaturated double bond. The resulting resin was designated resin (A-1).

SYNTHESIS EXAMPLE 2

Tris(2,3-epoxypropyl) isocyanurate was treated with carbonic acid gas to convert the epoxy group to a cyclocarbonate group in a usual manner to obtain a carbonate-containing triglycidyl isocyanurate. The resulting resin was designated resin (B-1).

SYNTHESIS EXAMPLE 3

In a flask equipped with a thermometer, a stirrer, and a reflux condenser were charged 187 g of a bisphenol A type epoxy resin having an epoxy equivalent of 187 ("Epiclon 850" produced by Dainippon Ink and Chemicals, Inc.), 72.0 g of acrylic acid, and 1.2 g of triphenylphosphine. The mixture was allowed to react at 110° C. until the acid value became 3 or less. Thereafter, 152 g of tetrahydrophthalic anhydride was added to the reaction mixture, and the reaction was further conducted at 100° C. until the acid value reached 137 to obtain a resin having a carboxylic acid group and an unsaturated double bond. The resulting resin was designated resin (A-2).

SYNTHESIS EXAMPLE 4

In a flask equipped with a thermometer, a stirrer, and a reflux condenser were charged 213 g of a cresol novolak type epoxy resin having an epoxy equivalent of 213 ("Epiclon N-695"), 72.0 g of acrylic acid, and 1.2 g of triphenylphosphine. The mixture was allowed to react at 110° C. until the acid value became 3 or less. Thereafter, 76.0 g of tetrahydrophthalic anhydride was added to the reaction mixture, and the reaction was further conducted at 100° C. until the acid value reached 76 to obtain a resin having a carboxylic acid group, an unsaturated double bond, and a hydroxyl group. The resulting resin was designated compound (m-1).

In a separate flask equipped with a thermometer, a stirrer, and a reflux condenser were charged 1 mol of tolylene diisocyanate and 1 mol of 2-hydroxyethyl acrylate, and the mixture was subjected to a urethanation reaction in a usual manner to obtain an unsaturated urethane compound having an unreacted isocyanate group at the urethane acrylate-terminated end group. The resulting compound was designated compound (u-1).

In a separate flask equipped with a thermometer, a stirrer, and a reflux condenser was added 285 g of compound (m-1), and 290 g of compound (u-1) was then added thereto slowly to conduct a urethanation reaction until the unreacted isocyanate group disappeared. There was obtained a compound having a carboxylic acid group and an unsaturated double bond. This compound was designated resin (A-3).

EXAMPLE 1

Resin (A-1) prepared in Synthesis Example 1 was mixed with other components as shown below, followed by thoroughly stirring to prepare a coating composition.

| | |
|---|---|
| Resin (A-1) | 100 parts |
| Resin (B-1) | 30 parts |
| 1-Hydroxyhexyl phenyl ketone | 3 parts |
| Imidazoleamine | 1 part |
| Methyl ethyl ketone | 30 parts |

The resulting coating composition was evaluated for storage stability according to the following test method.

1) Test on Stability

The coating composition was preserved in a thermostat set at 80° C. with light shielded, and any change of the solution state was observed and rated as follows.

Excellent: No change after 5 hrs' preservation
Good: No change after 3 hrs' preservation
Medium: Gelation observed after 3 hrs' preservation
Poor: Gelation observed after 1 hr's preservation The coating composition was coated on a wet-sanded tinplate to a thickness of 20 $\mu$m. The wet coating was cured by ultraviolet irradiation and then postcured by heating under the respective conditions shown in the following test methods. Each of the uncured wet coating film, the UV-cured film (before postcure) and the postcured film was evaluated according to the following test methods.

2) Test on Curing Properties

The wet coating film was dried in hot air at 80° C. for 15 minutes and then passed 15 cm below a medium-pressure mercury lamp (80 W/cm) at a speed of 50 m/min. The number of passes required for curing was recorded.

3) Test on Resistance to Water, Solvent, or Alkali

The wet coating film was irradiated with ultraviolet light emitted from a 80 W/cm medium-pressure mercury lamp placed 15 cm above for 60 seconds and then postcured in a heating furnace at 140° C. for 40 minutes. The postcured film was given 40 rubbings with gauze impregnated with deionized water, acetone, or a 10% sodium hydroxide aqueous solution. The loss in film thickness was measured and rated as follows.

Excellent: 0 to 5 $\mu$m
Good: 5 to 10 $\mu$m
Medium: 10 to 15 $\mu$m
Poor: 15 $\mu$m or more

4) Test on Heat Resistance

The wet coating film was dried in hot air at 80° C. for 15 minutes and then passed 10 times under a medium-pressure mercury lamp (80 W/cm) placed 15 cm above at a speed of 50 m/min. The thus UV-cured film was postcured by heating in a furnace at 140° C. for 40 minutes, followed by allowing to cool to room temperature. The cured film was placed in a heating furnace at 200° C. for 40 seconds. Immediately thereafter, gauze was stuck on the coating film. After cooling, the gauze was stripped off, and any change of the coating film was observed with the naked eye. The changes were rated as follows.

Excellent: No change observed at all.
Good: Slight traces of gauze observed.
Poor: The coating film melted and peeled away together with gauze.

The results of the evaluation are shown in Table 1 below.

EXAMPLE 2

A coating composition was prepared in the same manner as in Example 1, except for replacing resin (A-1) with resin (A-2) obtained in Synthesis Example 3. The resulting coating composition was coated and cured in the same manner as in Example 1.

The coating composition and the cured film were evaluated in the same manner as in Example 1. The results obtained are shown in Table 1.

EXAMPLE 3

A coating composition was prepared in the same manner as in Example 1, except for replacing resin (A-1) with resin (A-3) obtained in Synthesis Example 4. The resulting coating composition was coated and cured in the same manner as in Example 1.

The coating composition and the cured film were evaluated in the same manner as in Example 1. The results obtained are shown in Table 1.

EXAMPLE 4

Resin (A-1) prepared in Synthesis Example 1 was mixed with other components as shown below, followed by thoroughly stirring to prepare a coating composition.

| | |
|---|---|
| Resin (A-1) | 100 parts |
| Resin (B-1) | 40 parts |
| 1-Hydroxyhexyl phenyl ketone | 3 parts |
| Trimethylolpropane triacrylate | 20 parts |
| Methyl ethyl ketone | 20 parts |
| Imidazoleamine | 3 parts |

The resulting coating composition was coated and cured in the same manner as in Example 1, and evaluation was made in the same manner as in Example 1. The results obtained are shown in Table 1.

COMPARATIVE EXAMPLE 1

A coating composition was prepared in the same manner as in Example 1, except for replacing resin (B-1) with the same amount of a cresol novolak type epoxy resin ("EOCN" produced by Nippon Kayaku Co., Ltd.; epoxy equivalent=220). The resulting coating composition was coated and cured in the same manner as in Example 1, and evaluation was made in the same manner as in Example 1. The results obtained are shown in Table 1.

COMPARATIVE EXAMPLE 2

A coating composition was prepared in the same manner as in Example 1, except for replacing resin (B-1) with the same amount of a bisphenol A type epoxy resin ("RE-310S" produced by Nippon Kayaku Co., Ltd.; epoxy equivalent=185). The resulting coating composition was coated and cured in the same manner as in Example 1, and evaluation was made in the same manner as in Example 1. The results obtained are shown in Table 1.

TABLE 1

| | Example 1 | Example 2 | Example 3 | Example 4 | Comparative Example 1 | Comparative Example 2 |
|---|---|---|---|---|---|---|
| Stability | Excellent | Excellent | Excellent | Excellent | Poor | Medium |
| Curing Properties (times) | 2 | 1 | 1 | 2 | 2 | 5 |
| Water Resistance | Excellent | Excellent | Excellent | Excellent | Medium | Medium |
| Solvent Resistance | Excellent | Excellent | Excellent | Excellent | Good | Poor |
| Alkali Resistance | Excellent | Excellent | Excellent | Excellent | Good | Poor |
| Heat Resistance | Excellent | Good | Excellent | Excellent | Good | Poor |

As is apparent from the results in Table 1, the radiation-curing resin composition according to the present invention can be cured with radiation either at room temperature or even under heating. The composition is a one-pack type coating composition exhibiting excellent stability owing to the structure of the cyclocarbonate compound. Further, the structure based on the epoxy compound and the cyclocarbonate compound makes the composition excellent in not only curing properties but resistance to water, solvents and chemicals as well as heat resistance. Accordingly, the resin composition of the present invention is of high use in various applications.

As described and demonstrated above, the radiation-curing resin composition of the present invention is of one-pack type having excellent stability and provides a cured film excellent in water resistance, solvent resistance, chemical resistance, and heat resistance. Thus, the composition is very useful in a wide variety of applications as coating compounds, printing inks, adhesives, and so on.

While the invention has been described in detail and with reference to specific examples thereof, it will be apparent to one skilled in the art that various changes and modifications can be made therein without departing from the spirit and scope thereof.

What is claimed is:

1. A radiation-curing resin composition comprising, as essential components,
   (A) a resin having a carboxylic acid group and an unsaturated double bond, said resin being a reaction product obtained from a compound containing an epoxy group, a compound containing a reactive unsaturated double bond, and a compound containing an acid anhydride group, and
   (B) a compound containing a cyclocarbonate group.

2. A radiation-curing composition comprising, as essential components,
   (A) a resin having a carboxylic acid group and an unsaturated double bond, said resin being a reaction product obtained from a compound containing an epoxy group, an unsaturated monocarboxylic acid, and a compound containing an acid anhydride group, and
   (B) a compound containing a cyclocarbonate group.

* * * * *